(12) United States Patent
Liu et al.

(10) Patent No.: US 11,837,274 B2
(45) Date of Patent: Dec. 5, 2023

(54) METHOD AND APPARATUS FOR IMPROVING SYSTEM DRAM RELIABILITY, AND STORAGE MEDIUM

(71) Applicant: ZTE CORPORATION, Guangdong (CN)

(72) Inventors: Fengpeng Liu, Guangdong (CN); Dongmei Liu, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 216 days.

(21) Appl. No.: 17/610,718

(22) PCT Filed: May 19, 2020

(86) PCT No.: PCT/CN2020/091023
§ 371 (c)(1),
(2) Date: Nov. 12, 2021

(87) PCT Pub. No.: WO2021/036359
PCT Pub. Date: Mar. 4, 2021

(65) Prior Publication Data
US 2022/0223193 A1    Jul. 14, 2022

(30) Foreign Application Priority Data
Aug. 30, 2019  (CN) .......................... 201910826187.3

(51) Int. Cl.
*G06F 1/26* (2006.01)
*G11C 11/4074* (2006.01)
*G11C 29/50* (2006.01)

(52) U.S. Cl.
CPC .... *G11C 11/4074* (2013.01); *G11C 29/50004* (2013.01); *G11C 2029/5004* (2013.01)

(58) Field of Classification Search
CPC .......... G11C 11/4074; G11C 29/50004; G11C 2029/5004
See application file for complete search history.

(56) References Cited

U.S. PATENT DOCUMENTS

| | | | |
|---|---|---|---|
| 6,392,944 B1 | 5/2002 | Kono | |
| 9,141,177 B1* | 9/2015 | Nicholls | G11B 19/047 |
| 10,268,222 B1* | 4/2019 | Chang | G05F 1/561 |
| 10,684,634 B1* | 6/2020 | Yang | G06F 1/28 |
| 2013/0170286 A1 | 7/2013 | Daudelin et al. | |
| 2019/0066810 A1* | 2/2019 | Jean | G11C 16/26 |

OTHER PUBLICATIONS

Extended European Search Report of Counterpart European Patent Application No. 20859130.5 dated Dec. 2, 2022.

* cited by examiner

*Primary Examiner* — Min Huang
(74) *Attorney, Agent, or Firm* — HAUPTMAN HAM, LLP

(57) ABSTRACT

A method and apparatus for improving a system DRAM reliability, and a non-transitory computer-readable storage medium. The method comprises: obtaining an apparent voltage of a DRAM, and performing a reliability check on a voltage value of the apparent voltage (S100); according to a verification result of the reliability check, calculating a voltage deviation value of a power supply voltage under an ideal DRAM model (S200); and according to the voltage deviation value, adjusting the power supply voltage of the DRAM (S300).

14 Claims, 8 Drawing Sheets

METHOD AND APPARATUS FOR IMPROVING SYSTEM DRAM RELIABILITY, AND STORAGE MEDIUM

CROSS-REFERENCE TO RELATED APPLICATION

This application claims the priority of Chinese patent application No. 201910826187.3, entitled "Method and Apparatus for Improving System DRAM Reliability, and Storage Medium" and filed on Aug. 30, 2019, the entirety of which is incorporated herein by reference.

FIELD OF THE INVENTION

The present disclosure relates to the technical field of electronic devices, and in particular, to a method and an apparatus for improving system DRAM reliability, and a non-transitory computer readable storage medium.

BACKGROUND OF THE INVENTION

DRAM, i.e., dynamic random access memory, is a common system memory. The main functional principle of a dynamic random access memory is to represent whether a bit is 1 or 0 depending on the amount of charges stored in a capacitor. Nowadays, with the popularization of internet and intelligent devices, users put forward higher requirements for the rate, power consumption, and reliability of the DRAM.

However, at the current stage, the bias sensing of a sense amplifier is improved mainly by disposing a voltage coupling/decoupling device in a Dynamic Random Access Memory device, called a DRAM device, so as to achieve the purpose of ensuring the DRAM reliability. However, such a control approach achieves limited improvement, and there is still a circumstance that the DRAM reliability is unstable.

SUMMARY OF THE INVENTION

According to the present disclosure, it is provided a method and an apparatus for improving system DRAM reliability, and a non-transitory computer readable storage medium, so as to enable a system DRAM to have higher reliability.

In one aspect, the present disclosure provides a method for improving system DRAM reliability. The method for improving system DRAM reliability includes steps of: obtaining an apparent voltage of a Dynamic Random Access Memory, called a DRAM, and performing a reliability check on a voltage value of the apparent voltage; calculating a voltage deviation value of a power supply voltage under an ideal DRAM model according to a verification result of the reliability check; and adjusting the power supply voltage of the DRAM according to the voltage deviation value.

In another aspect, the present disclosure further provides an apparatus for improving system DRAM reliability. The apparatus for improving system DRAM reliability includes: a memory, a processor, and a program for improving system DRAM reliability that is stored on the memory and capable of running on the processor. The program for improving system DRAM reliability, when executed by the processor, implements steps of the above method for improving system DRAM reliability.

In still another aspect, the present disclosure further provides a non-transitory computer readable storage medium. The non-transitory computer readable storage medium stores a program for improving system DRAM reliability thereon. The program for improving system DRAM reliability, when executed by a processor, implements steps of the above method for improving system DRAM reliability.

Further implementation, functional characteristics, and advantages of the present disclosure will be described in detail followed by embodiments with reference to the accompanying drawings.

DETAILED DESCRIPTION OF THE EMBODIMENTS

It should be understood that, specific embodiments described herein are only used for explaining the present disclosure, rather than limiting the present disclosure.

Figure 1:
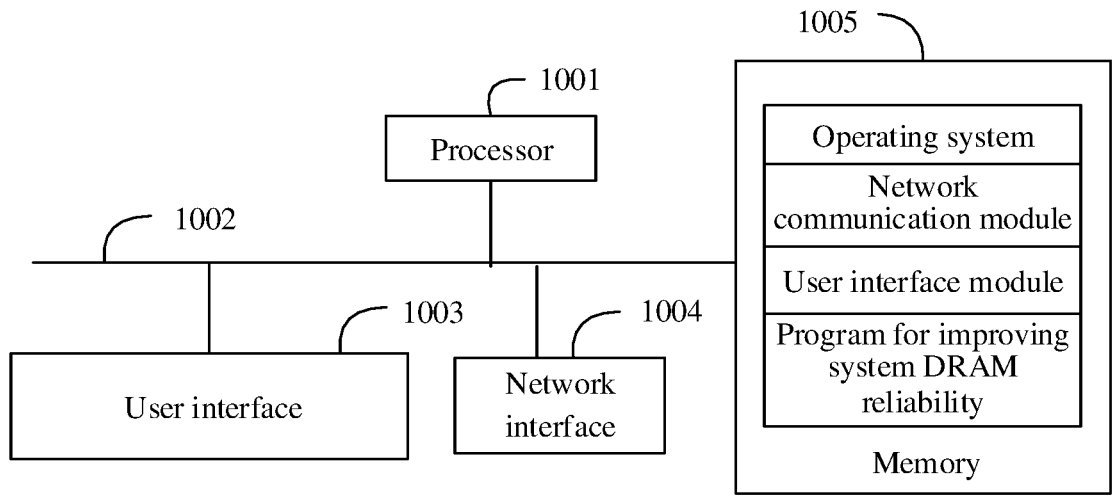
FIG. 1 schematically shows a structure of an apparatus in a hardware operating environment involved in embodiments of the present disclosure.

Referring to FIG. 1, there is schematically shown a structure of an apparatus in a hardware operating environment involved in embodiments of the present disclosure.

A terminal in the embodiments of the present disclosure may be a PC, or may be a terminal device having a data processing function, such as a smart phone, a tablet computer, a portable computer, and so on.

As shown in FIG. 1, the terminal may include a processor 1001, such as a CPU, a network interface 1004, a user interface 1003, a memory 1005, and a communication bus 1002. Herein, the communication bus 1002 is configured to realize connection and communication among these components. The user interface 1003 may include a display screen and an input unit, such as a keyboard. In an embodiment, the user interface 1003 may further include a standard wired interface and a standard wireless interface. In an embodiment, the network interface 1004 may include a standard wired interface and a standard wireless interface (such as a Wi-Fi interface). The memory 1005 may be a high-speed RAM memory, or may be a non-volatile memory, such as a disk memory. In an embodiment, the memory 1005 may also be a storage device independent of the aforementioned processor 1001.

In an embodiment, the terminal further includes a camera, an RF (radio frequency) circuit, a sensor, an audio circuit, a Wi-Fi module, and so on. Herein, examples of the sensor include a light sensor, a motion sensor, and other sensors. In an embodiment, the light sensor may include an ambient light sensor and a proximity sensor. Herein, the ambient light sensor may adjust the lightness of the display screen according to an intensity of the ambient light, and the proximity sensor may turn off the display screen and/or backlight when a mobile terminal moves to the ear. As one kind of the motion sensor, a gravity acceleration sensor may detect a magnitude of acceleration in respective directions (generally three axes), may detect a magnitude and a direction of gravity when the terminal stays still, and may be configured for identifying a posture of the mobile terminal (such as switching between a horizontal screen and a vertical screen, relevant games, magnetometer pose calibration), functions associated with vibration identification (such as pedometer and tapping), and so on. It is certain that the mobile terminal may also be equipped with other sensors, such as a gyroscope, a barometer, a hygrometer, a thermometer, and an infrared sensor, and details are not described herein.

Those skilled in the art may understand that, the structure of the terminal shown in FIG. 1 does not constitute limitation to the terminal, and may include more or less components than those shown, combine with certain components, or have a different arrangement of the components.

As shown in FIG. 1, the memory 1005, which serves as a computer storage medium, may include an operating system, a network communication module, a user interface module, and a program for improving system DRAM reliability.

In the terminal shown in FIG. 1, the network interface 1004 is mainly configured to connect to a background server so as to communicate data with the background server. The user interface 1003 is mainly configured to connect to a client terminal (user terminal) so as to communicate data with the client terminal. The processor 1001 may be configured to invoke the program for improving system DRAM reliability stored in the memory 1005 to execute operations of: obtaining an apparent voltage of a DRAM, and performing a reliability check on a voltage value of the apparent voltage; calculating a voltage deviation value of a power supply voltage under an ideal DRAM model according to a verification result of the reliability check; and adjusting the power supply voltage of the DRAM according to the voltage deviation value.

In an embodiment, the processor 1001 may invoke the program for improving system DRAM reliability stored in the memory 1005 to further execute the following operations. The step of adjusting the power supply voltage of the DRAM according to the voltage deviation value includes: performing the reliability check on the voltage value of the apparent voltage again after adjusting the power supply voltage of the DRAM; and returning to the step of calculating the voltage deviation value under the ideal DRAM model according to the verification result of the reliability check, if a result of the check is failure.

In an embodiment, the processor 1001 may invoke the program for improving system DRAM reliability stored in the memory 1005 to further execute the following operations. The step of calculating the voltage deviation value of the power supply voltage under the ideal DRAM model according to the verification result of the reliability check includes:

increasing a voltage test value of the power supply voltage by one preset voltage increment value, if a result of the check is failure, to obtain a new voltage test value of the power supply voltage.

In an embodiment, the processor 1001 may invoke the program for improving system DRAM reliability stored in the memory 1005 to further execute the following operations. The step of calculating the voltage deviation value of the power supply voltage under the ideal DRAM model according to the verification result of the reliability check includes: decreasing a voltage test value of the power supply voltage by one preset voltage decrement value, if a result of the check is success, to obtain a new voltage test value of the power supply voltage.

In an embodiment, the processor 1001 may invoke the program for improving system DRAM reliability stored in the memory 1005 to further execute the following operations.

The method for improving system DRAM reliability further include: obtaining a power supply capacitance value of the DRAM, and adjusting the power supply capacitance value of the DRAM according to a preset rule to obtain an adjusted capacitance value of the DRAM, until an apparent voltage corresponding to the adjusted capacitance value of the DRAM is greater than or equal to a preset threshold voltage.

In an embodiment, the processor 1001 may invoke the program for improving system DRAM reliability stored in the memory 1005 to further execute the following operations. The step of obtaining the power supply capacitance value of the DRAM, and adjusting the power supply capacitance value of the DRAM according to the preset rule to obtain the adjusted capacitance value of the DRAM, until the apparent voltage corresponding to the adjusted capacitance value of the DRAM is greater than or equal to the preset threshold voltage includes: determining whether the power supply voltage value of the DRAM changes according to the voltage deviation value; decreasing the capacitance value of the DRAM by one preset capacitance decrement value, if the power supply voltage value of the DRAM changes, to obtain a test value of adjusted capacitance, and performing a reliability check on the adjusted capacitance; and returning, if a result of the reliability check is that the apparent voltage is less than the preset threshold voltage, to the step of: decreasing the capacitance value of the DRAM by one preset capacitance decrement value to obtain the test value of the adjusted capacitance, and performing a reliability check on the adjusted capacitance, until the apparent voltage corresponding to the adjusted capacitance of the DRAM is greater than or equal to the preset threshold voltage.

In an embodiment, the processor 1001 may invoke the program for improving system DRAM reliability stored in the memory 1005 to further execute the following operations. The step of obtaining the power supply capacitance value of the DRAM, and adjusting the power supply capacitance value of the DRAM according to the preset rule to obtain an adjusted capacitance value of the DRAM, until the apparent voltage corresponding to the adjusted capacitance value of the DRAM is greater than or equal to the preset threshold voltage further includes: increasing the capacitance value of the DRAM by one preset capacitance increment value, if the power supply voltage value of the DRAM does not change, to obtain a test value of adjusted capacitance, and performing a reliability check on the adjusted capacitance; and returning, if a result of the reliability check is that the apparent voltage is greater than or equal to the preset threshold voltage, to the step of: increasing the capacitance value of the DRAM by one preset capacitance increment value to obtain the test value of the adjusted capacitance, and performing the reliability check on the adjusted capacitance, until the apparent voltage corresponding to the adjusted capacitance of the DRAM is less than the preset threshold voltage.

In one embodiment, the processor 1001 may invoke the program for improving system DRAM reliability stored in the memory 1005, to further execute the following operations. A capacitor is a variable capacitor.

Specific embodiments of the apparatus for improving system DRAM reliability are substantially similar to those of the method for improving system DRAM reliability described below, and details are not provided herein.

Figure 2:
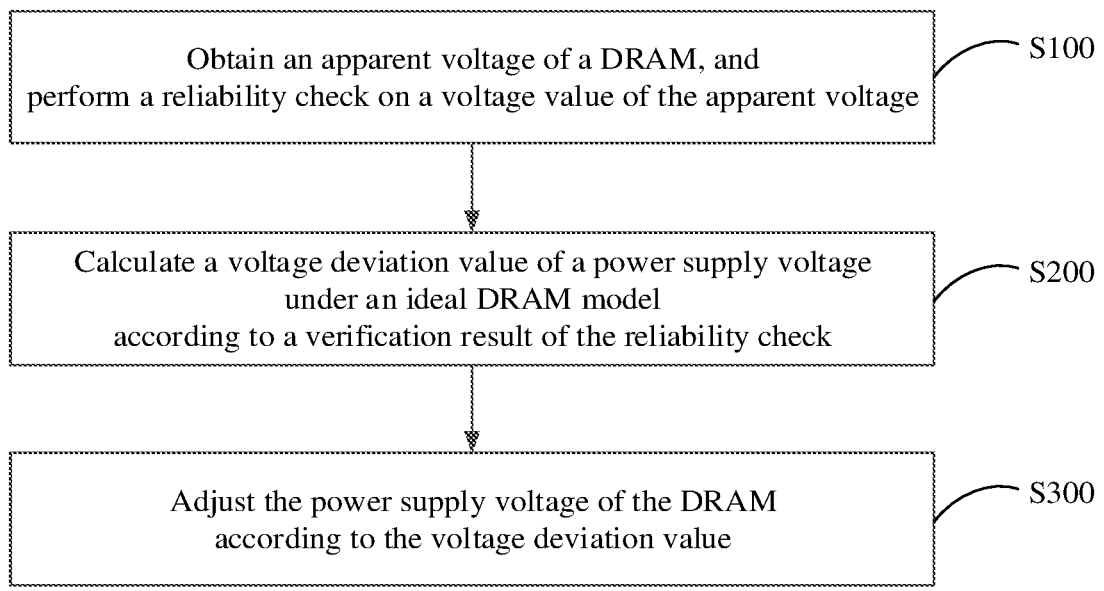
FIG. 2 schematically shows a flowchart of a first embodiment of a method for improving system DRAM reliability according to the present disclosure.

Referring to FIG. 2, there is schematically shown a flowchart of a first embodiment of the method for improving system DRAM reliability according to the present disclosure. The method for improving system DRAM reliability includes the following steps S100 to S300.

At step S100, an apparent voltage of a DRAM is obtained, and a reliability check is performed on a voltage value of the apparent voltage.

This method is provided for solving the problem that DRAM system reliability deterioration or even system crash may be caused by factors such as system overload and environment deterioration after a DRAM package chip is integrated to a system. The present disclosure provides a method for enabling a system DRAM to have higher reliability under the premise of achieving high rate and low power consumption.

Figure 8:
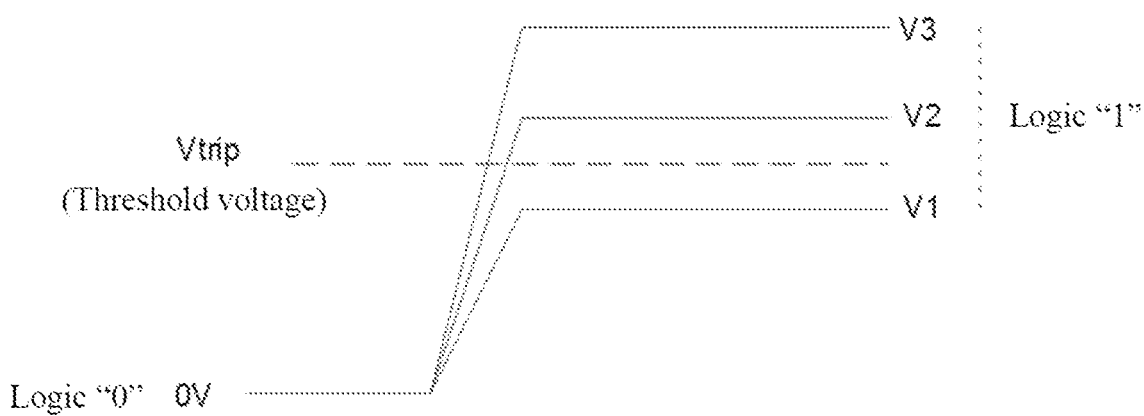
FIG. 8 schematically shows logic output in the first embodiment of the method for improving system DRAM reliability according to the present disclosure.

For better understanding, output logic of a DRAM chip will be explained first. Referring to FIG. 8, when an apparent voltage is 0 V, output of the DRAM chip is "0". When a power supply voltage is stable, output of the apparent voltage may be any voltage value of V1, V2, or V3. At this time, when the voltage value of the apparent voltage is not 0, the output of the DRAM chip should be "1" theoretically. However, influenced by many factors such as the environment, the process, and the aging degree, when the voltage value of the apparent voltage is V1, since V1 is lower than a threshold voltage value Vtrip of the DRAM chip, output error may occur to the DRAM chip according to logic, so that "0" is output. Accordingly, reliability of an output result of the DRAM chip is affected, and thus low system DRAM reliability is caused. Accordingly, the present disclosure provides a method for improving system DRAM reliability. The voltage value of the apparent voltage is kept to be above the threshold voltage value by suitable adjustment, so that the apparent voltage can be output correctly all the time according to the logic, thereby improving system DRAM reliability. The apparent voltage fluctuates on the basis of the power supply voltage, and the power supply voltage is a voltage value designed to be provided by the power supply of the system. Thus, the present solution is provided to adjust the power supply so as to enable the apparent voltage fluctuating on the basis of the power supply voltage to stabilize within a reasonable range, so that the apparent voltage can always be output correctly, thereby improving system DRAM reliability. In the present embodiment, the apparent voltage of the DRAM is obtained, and the reliability check, i.e., output logic verification, is performed on the voltage value of the apparent voltage, so as to determine whether a logic output result of DRAM is correct.

At step S200, a voltage deviation value of a power supply voltage under an ideal DRAM model is calculated according to a verification result of the reliability check. After the reliability check is performed, the voltage deviation value of the power supply voltage under the ideal DRAM model is calculated according to the verification result of the reliability check. That is, according to the verification result of the reliability check, the voltage deviation value of the power supply voltage under the ideal DRAM model is calculated. The ideal DRAM model represents an optimal apparent voltage, such as V2, for the system DRAM performing logical output. The voltage deviation value is a difference value between a power supply voltage corresponding to the optimal apparent voltage of the ideal DRAM model and a real-time power supply voltage. For example, if the apparent voltage under the ideal DRAM model is V2, when an actually measured apparent voltage is V1, the reliability check cannot be passed successfully, and then a difference value between the power voltage corresponding to the apparent voltage V1 and the power supply voltage corresponding to the apparent voltage V2 under the ideal DRAM model is obtained by calculating and used as the voltage deviation value.

When an actually measured apparent voltage is V3, if V3 is too high, power consumption will increase, and ringing easily occurs, thereby reducing reliability. Therefore, although in the present embodiment, the apparent voltage is V3, which has passed the reliability check, an ideal power supply voltage value when the apparent voltage is V3 may be calculated by means of the ideal DRAM model, and a difference value between an actual voltage when the apparent voltage is V3 and the ideal power supply voltage value when the apparent voltage is V3 may be calculated and used as the voltage deviation value.

It is certain that in an exemplary embodiment, since V3 has passed the reliability check, no processing and adjustment may be performed on V3.

At step S300, the power supply voltage of the DRAM is adjusted according to the voltage deviation value.

After the voltage deviation value of the power supply voltage under the ideal DRAM model is obtained, the power supply voltage of the DRAM is adjusted according to the voltage deviation value, so as to enable the adjusted apparent voltage to be stably output under an ideal state, such as V2. The power supply voltage is adjusted to be in a state under the ideal DRAM model according to the voltage deviation value, i.e., the apparent voltage being adjusted to be the logically output optimal voltage, so as to enable the apparent voltage to be in the optimal output state, thereby improving the system DRAM reliability.

The present disclosure provides a method and an apparatus for improving system DRAM reliability, and a computer storage medium. In this method, an apparent voltage of a DRAM is obtained, and a reliability check is performed on a voltage value of the apparent voltage; a voltage deviation value of a power supply voltage under an ideal DRAM model is calculated according to a verification result of the reliability check; and the power supply voltage of the DRAM is adjusted according to the voltage deviation value. By the above manner, the present disclosure can perform the reliability check on the apparent voltage and obtain the voltage deviation value of the power supply voltage corresponding to the apparent voltage and the power supply voltage corresponding to apparent voltage under the ideal model according to a result of the reliability check, so as to adjust the power supply voltage according to the voltage deviation value. In this way, the apparent voltage on the basis of the power supply voltage is in the optimal logic output state, and the apparent voltage can be well output logically, thereby improving system DRAM reliability.

Figure 3:
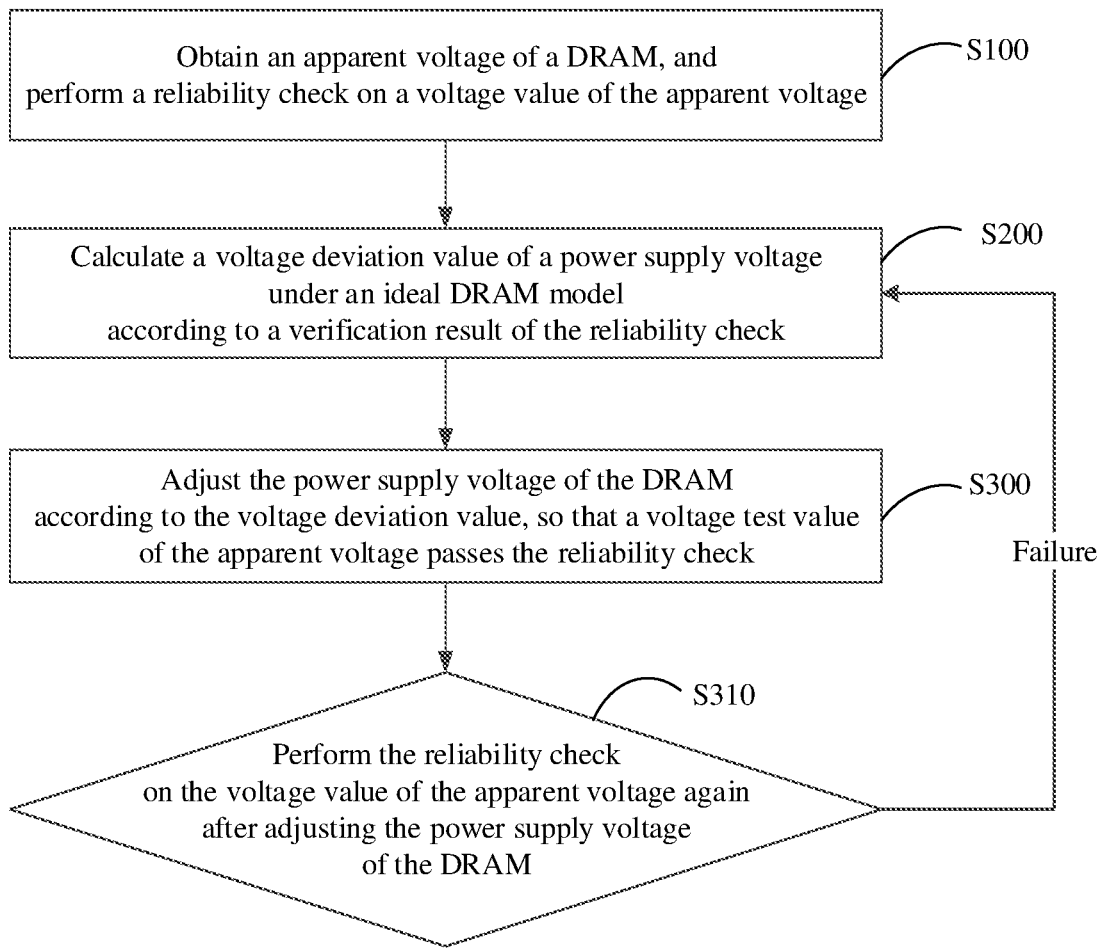
FIG. 3 schematically shows a flowchart of a second embodiment of the method for improving system DRAM reliability according to the present disclosure.

Referring to FIG. 3, there is schematically shown a flowchart of a second embodiment of the method for improving system DRAM reliability according to the present disclosure.

Based on the above embodiment, in the present embodiment, after the step S300, the method includes a step S310 of performing the reliability check on the voltage value of the apparent voltage again after adjusting the power supply voltage of the DRAM; and returning to the step S200 of calculating the voltage deviation value under the ideal DRAM model according to the verification result of the reliability check, if a result of the check is failure.

In the present embodiment, after adjusting the power supply voltage of the DRAM, the reliability check is performed on the voltage value of the apparent voltage again; and if a result of the check after adjustment is failure, the process returns to the step of calculating the voltage deviation value under the ideal DRAM model according to the verification result of the reliability check. The voltage deviation value between the power supply voltage corresponding to the apparent voltage V1 and the power supply voltage corresponding to the apparent voltage V2 under the ideal DRAM model is recalculated.

Figure 4:
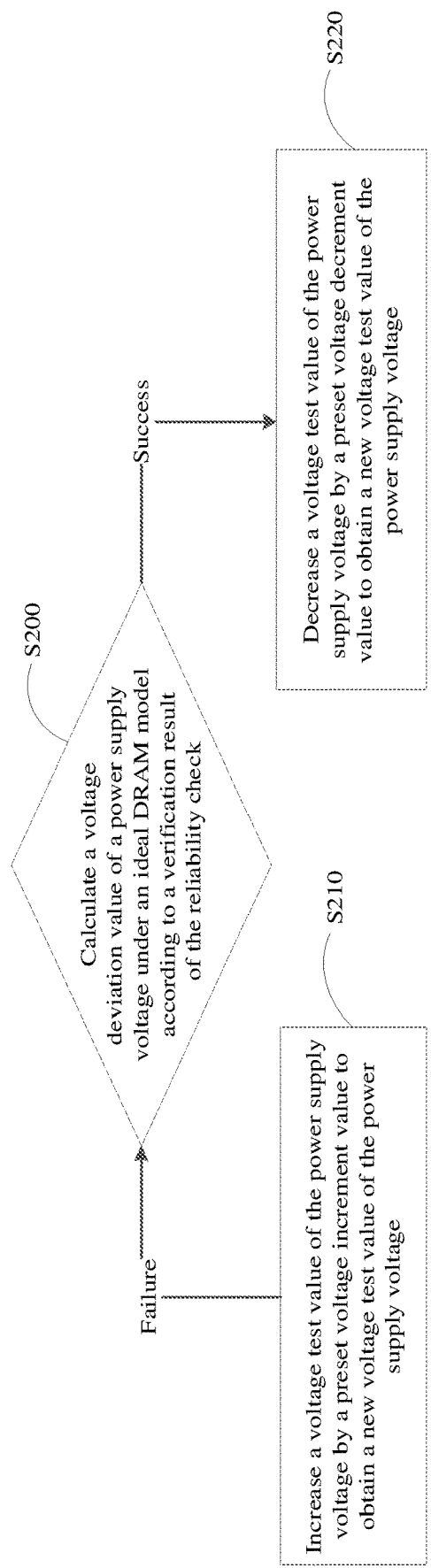
FIG. 4 schematically shows a flowchart of a third embodiment of the method for improving system DRAM reliability according to the present disclosure.

Referring to FIG. 4, there is schematically shown a flowchart of a third embodiment of the method for improving system DRAM reliability according to the present disclosure.

Based on the above embodiment, in the present embodiment, after the step S200, the method includes performing a step S210 of increasing a voltage test value of the power supply voltage by one preset voltage increment value to obtain a new voltage test value of the power supply voltage, if a result of the check is failure.

In the present embodiment, in the step of calculating the voltage deviation value of the power supply voltage under the ideal DRAM model according to the verification result of the reliability check, if the result of the check is failure, the voltage test value of the power supply voltage is increased by one preset voltage increment value to obtain the new voltage test value of the power supply voltage. The voltage test value may be used to further perform the reliability check.

In an embodiment, the method further includes performing a step S220 of decreasing a voltage test value of the power supply voltage by one preset voltage decrement value to obtain a new voltage test value of the power supply voltage, if a result of the check is success.

In the step of calculating the voltage deviation value of the power supply voltage under the ideal DRAM model according to the verification result of the reliability check, if the result of the check is success, the voltage test value of the power supply voltage is decreased by one preset voltage decrement value to obtain the new voltage test value of the power supply voltage. The voltage test value may be used to further perform the reliability check.

Figure 9:
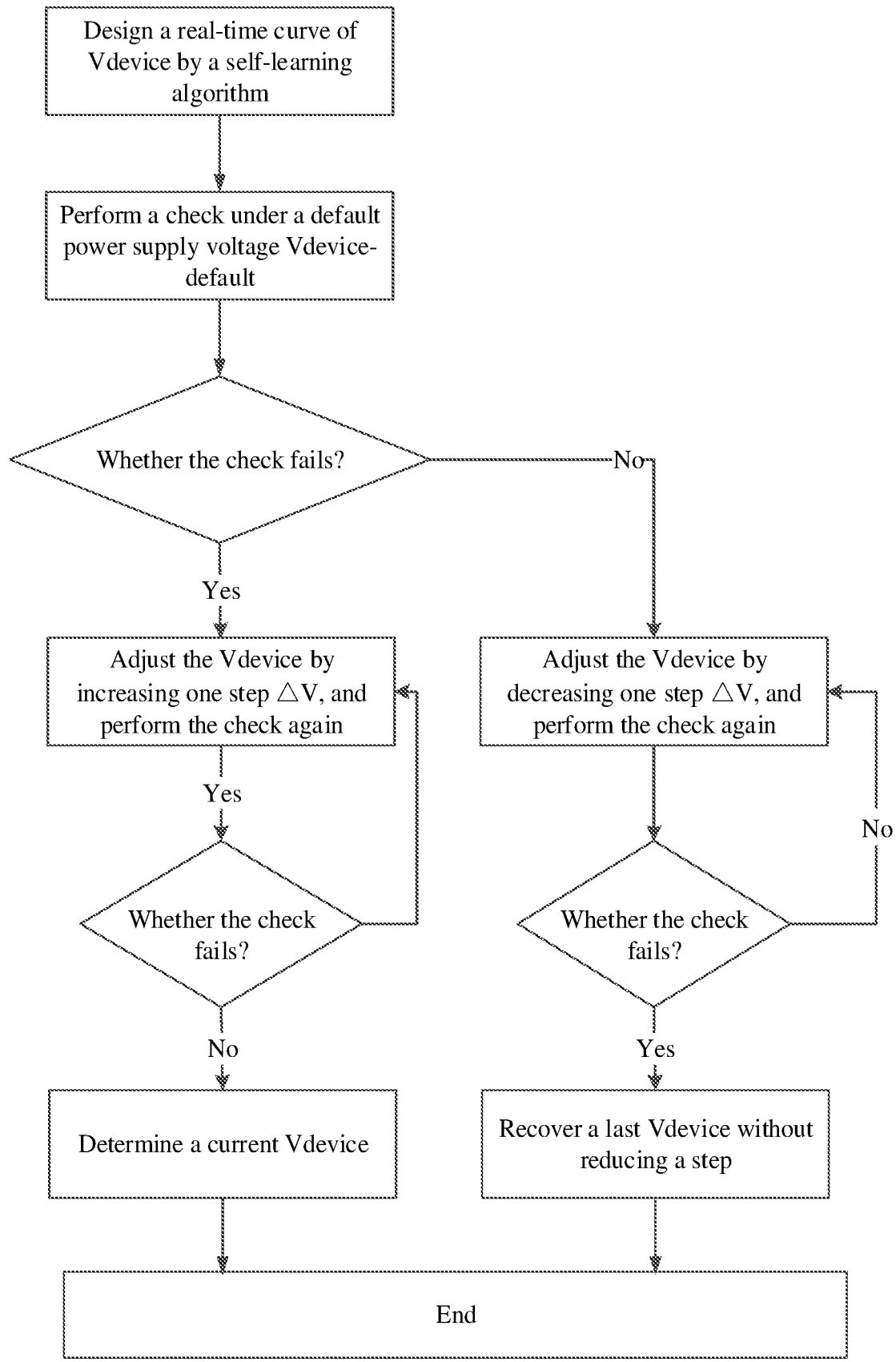
FIG. 9 schematically shows a voltage calculation process in the third embodiment of the method for improving system DRAM reliability according to the present disclosure.

Referring to FIG. 9, according to the description of the above embodiment, as an embodiment, the whole voltage calculation process herein may be as shown in FIG. 9. Firstly, calculation is performed by a self-learning algorithm, and a curve of Vdevice is designed. Then, a check is performed under a default power supply voltage Vdevice-default. If the check fails, the voltage is defined to be undervoltage; and if the check succeeds, the voltage is defined to be overvoltage.

Secondly, if the voltage is in an undervoltage state, for example, in a V1 state, the power supply voltage is adjusted by increasing one step ΔV, and the check is performed again. If the check succeeds, a current power supply voltage is determined, and the process ends; and if the check fails, this step is repeated.

Then, if the voltage is in an overvoltage state, for example, in a V2 or V3 state, the power supply voltage is adjusted by decreasing one step ΔV, and the check is performed again. If the check fails, a last power supply voltage is recovered without decreasing a step, and the process ends; and if the check succeeds, this step is repeated.

Finally, the power supply voltage is adjusted dynamically, to ensure that the apparent voltage just meets a trigger threshold, thereby ensuring stability of the logic 1.

Figure 5:
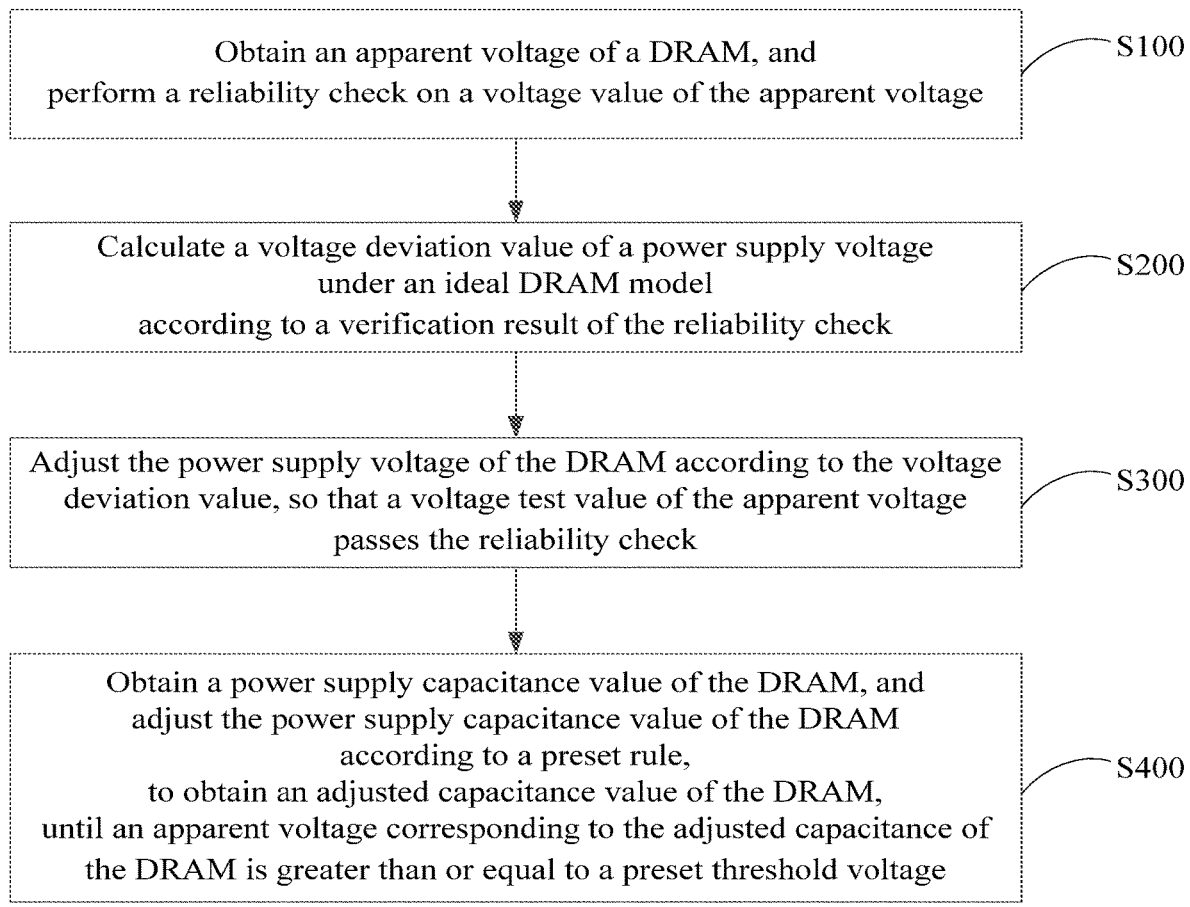
FIG. 5 schematically shows a flowchart of a fourth embodiment of the method for improving system DRAM reliability according to the present disclosure.

Referring to FIG. 5, there is schematically shown a flowchart of a fourth embodiment of the method for improving system DRAM reliability according to the present disclosure.

Based on the above embodiment, in the present embodiment, the method further includes a step S400 of obtaining a power supply capacitance value of the DRAM and adjusting the power supply capacitance value of the DRAM according to a preset rule to obtain an adjusted capacitance value of the DRAM, until an apparent voltage corresponding to adjusted capacitance of the DRAM is greater than or equal to a preset threshold voltage.

The DRAM chip is provided therein with a capacitor. The larger a capacitance value of the capacitor is, the gradual the slope is, and then the longer the response time of voltage adjustment of the DRAM is. Moreover, the power supply voltage is calculated by the algorithm in real time, and there exists time delay. Therefore, in order to further improve the reliability of the DRAM system, the present embodiment adjusts the power supply capacitance value of the DRAM to improve a response rate of the DRAM, so as to improve the reliability of the DRAM. The ratio is the main part of time delay, and indicates a response time of external power supply, i.e., transient response performance of a power supply device which supplies the apparent voltage. In the present embodiment, the power supply capacitance value of the DRAM is obtained, and the power supply capacitance value of the DRAM is adjusted according to the preset rule to obtain the adjusted capacitance value of the DRAM, until the apparent voltage corresponding to the adjusted capacitance of the DRAM is greater than or equal to the preset threshold voltage. In the present embodiment, the capacitor may be a variable capacitor. By replacing a decoupling capacitor or a filtering capacitor of a power supply in the existing solution with a variable capacitor, it can be ensured that the capacitance value of the capacitor may be adjusted while performing decoupling and filtering processing, so that the capacitor can ensure a good response rate.

In the present embodiment, the capacitance value of the DRAM is obtained, and the capacitance value of the DRAM is adjusted, so that the apparent voltage corresponding to the adjusted capacitance of the DRAM is greater than or equal to the preset threshold voltage. In this way, it can be well ensured that a response rate of the voltage adjustment of the DRAM is kept within a certain response rate range, so as to ensure the transient response performance of the power supply device which supplies the Vdevice.

Figure 6:
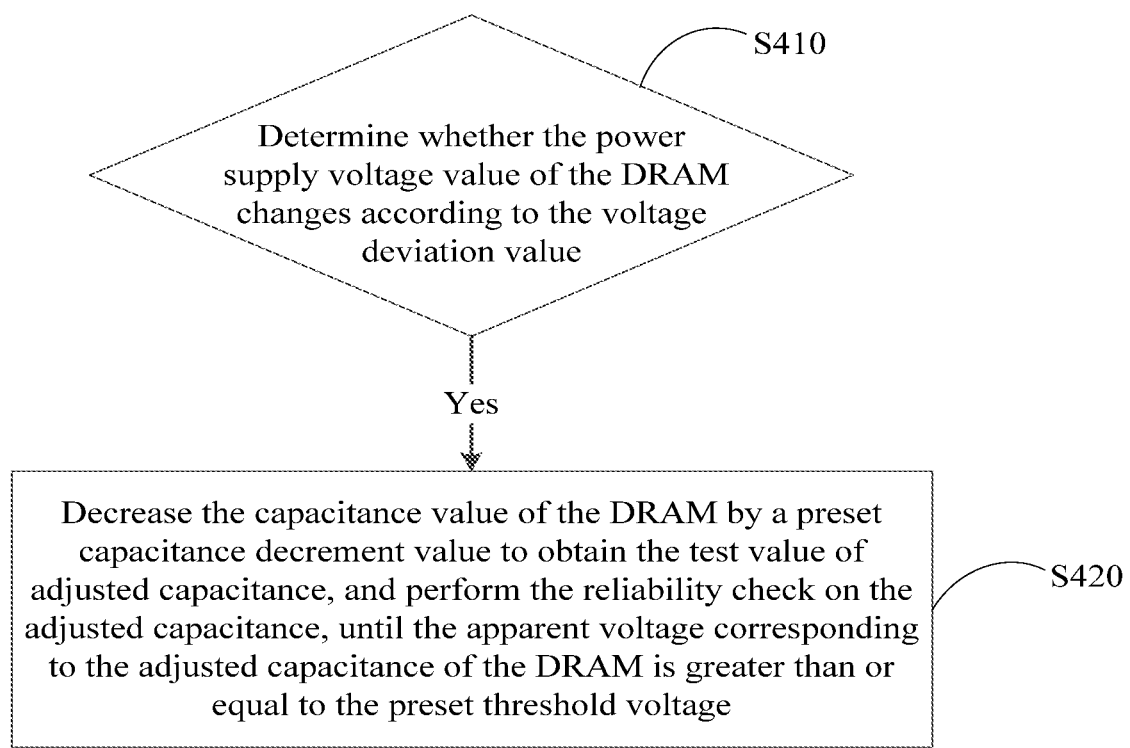
FIG. 6 schematically shows a flowchart of a fifth embodiment of the method for improving system DRAM reliability according to the present disclosure.

Referring to FIG. 6, there is schematically shown a flowchart of a fifth embodiment of the method for improving system DRAM reliability according to the present disclosure.

Based on the above embodiment, in the present embodiment, the step S400 includes a step S410 of determining whether the power supply voltage value of the DRAM changes according to the voltage deviation value. In the present embodiment, before adjusting the power supply capacitance value of the DRAM according to the preset rule to obtain the adjusted capacitance value of the DRAM, it is required to determine whether the power supply voltage value of the DRAM changes according to the voltage deviation value.

If the power supply voltage value of the DRAM changes, a step S420 is performed by decreasing the capacitance value of the DRAM by one preset capacitance decrement value to obtain a test value of adjusted capacitance, and performing a reliability check on the adjusted capacitance. That is, if the power supply voltage value of the DRAM changes, the capacitance value of the DRAM is decreased by one preset capacitance decrement value to obtain the test value of adjusted capacitance, and the reliability check is performed on the adjusted capacitance.

If the result of the reliability check is that the apparent voltage is less than the preset threshold voltage, the method returns to the step S420 of decreasing the capacitance value of the DRAM by one preset capacitance decrement value to obtain the test value of adjusted capacitance, and performing the reliability check on the adjusted capacitance, until the apparent voltage corresponding to the adjusted capacitance of the DRAM is greater than or equal to the preset threshold voltage.

If the result of the reliability check is that the apparent voltage is less than the preset threshold voltage, the method proceeds to a step of decreasing the capacitance value of the DRAM by one preset capacitance decrement value to obtain the test value of adjusted capacitance, and performing the reliability check on the adjusted capacitance, until the apparent voltage corresponding to the adjusted capacitance of the DRAM is greater than or equal to the preset threshold voltage.

Figure 7:
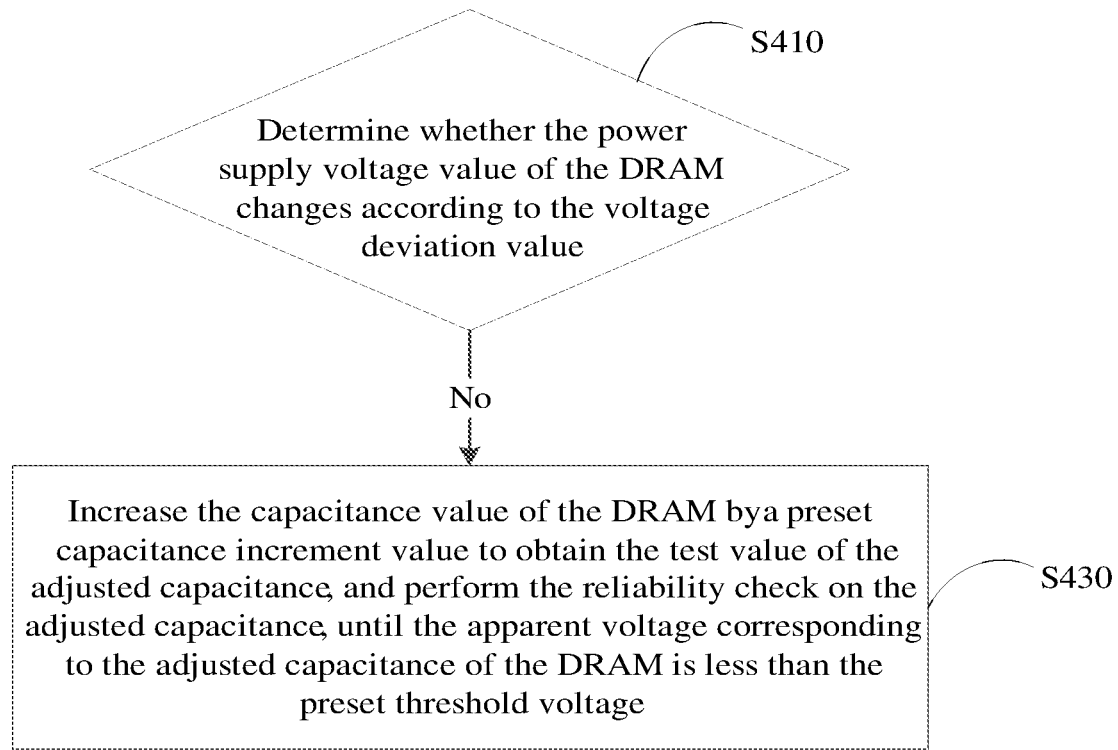
FIG. 7 schematically shows a flowchart of a sixth embodiment of the method for improving system DRAM reliability according to the present disclosure.

Referring to FIG. 7, there is schematically shown a flowchart of a sixth embodiment of the method for improving system DRAM reliability according to the present disclosure.

Based on the above embodiment, in the present embodiment, the step S400 includes that if the power supply voltage value of the DRAM does not change, a step S430 is performed by increasing the capacitance value of the DRAM by one preset capacitance increment value to obtain the test value of the adjusted capacitance, and performing the reliability check on the adjusted capacitance. In the present embodiment, if the power supply voltage value of the DRAM does not change, the capacitance value of the DRAM is increased by one preset capacitance increment value to obtain the test value of the adjusted capacitance, and the reliability check is performed on the adjusted capacitance.

If a result of the reliability check is that the apparent voltage is greater than or equal to the preset threshold voltage, the method returns to the step S430 of increasing the capacitance value of the DRAM by one preset capacitance increment value to obtain the test value of the adjusted capacitance, and performing the reliability check on the adjusted capacitance, until the apparent voltage corresponding to the adjusted capacitance of the DRAM is less than the preset threshold voltage.

If a result of the reliability check is that the apparent voltage is greater than or equal to the preset threshold voltage, the method proceeds to the following step of: increasing the capacitance value of the DRAM by one preset capacitance increment value to obtain the test value of the adjusted capacitance, and performing the reliability check on the adjusted capacitance, until the apparent voltage corresponding to the adjusted capacitance of the DRAM is less than the preset threshold voltage.

Figure 10:
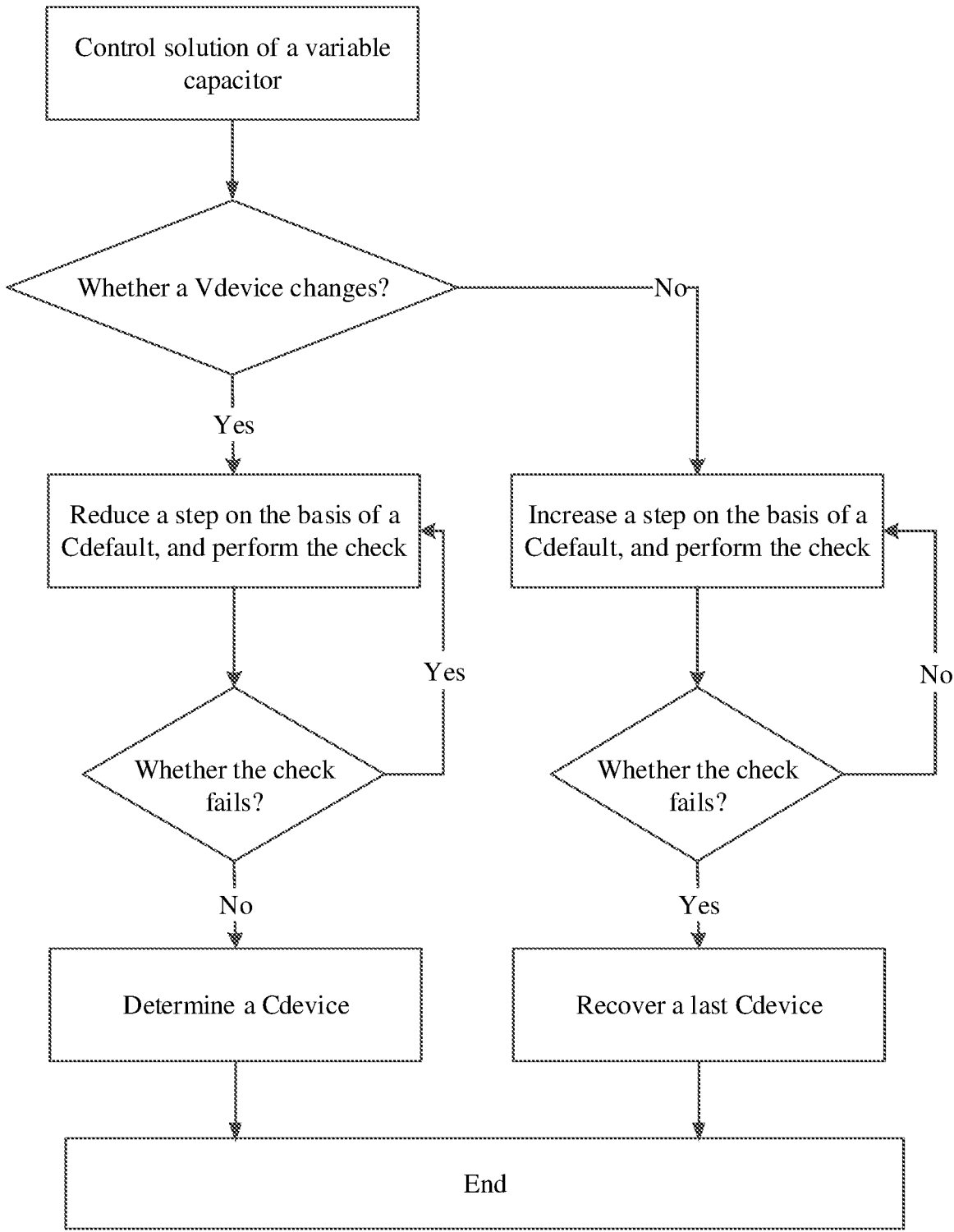
FIG. 10 schematically shows a capacitance calculation process in the sixth embodiment of the method for improving system DRAM reliability according to the present disclosure.

Referring to FIG. 10, according to the description of the above embodiment, as an embodiment, the whole capacitance calculation process herein may be as shown in FIG. 10.

Firstly, if the power supply voltage changes, the variable capacitor is decreased by one step on the basis of a default capacitance value Cdefault, and a check is performed. If the check fails, this process is repeated; and if the check succeeds, a current capacitance value Cdevice is determined, and the process ends.

Secondly, if the power supply voltage does not change, the variable capacitor is increased by one step on the basis of the default capacitance value Cdefault, and a check is performed. If the check fails, a last capacitance value Cdevice is recovered, and the process ends; and if the check succeeds, this process is repeated.

Finally, a reasonable capacitance value will ensure a response rate, and meantime consideration can be given to filtering and decoupling functions. In an exemplary embodiment, adjustment based on the change of the power supply voltage may not be performed. For example, the capacitance value may be adjusted directly according to the current verification result of the reliability check.

In addition, an embodiment of the present embodiment provides a non-transitory computer readable storage medium.

The non-transitory computer readable storage medium stores a program for improving system DRAM reliability thereon. The program for improving system DRAM reliability, when executed by a processor, implements steps of the aforementioned method for improving system DRAM reliability.

Herein, for the method implemented when the program for improving system DRAM reliability running on the processor is executed, reference can be made to respective embodiments of the method for improving system DRAM reliability, and details are not provided herein.

The present disclosure provides a method and an apparatus for improving system DRAM reliability, and a computer storage medium. In this method, an apparent voltage of a DRAM is obtained, and a reliability check is performed on a voltage value of the apparent voltage; a voltage deviation value of a power supply voltage under an ideal DRAM model is calculated according to a verification result of the reliability check; and the power supply voltage of the DRAM is adjusted according to the voltage deviation value. By the above manner, the present disclosure can perform the reliability check on the apparent voltage and obtain the voltage deviation value of the power supply voltage corresponding to the apparent voltage and the power supply voltage corresponding to apparent voltage under the ideal model according to a result of the reliability check, so as to adjust the power supply voltage according to the voltage deviation value. In this way, the apparent voltage on the basis of the power supply voltage is in the optimal logic output state, and the apparent voltage can be well output logically, thereby improving system DRAM reliability.

It should be noted that, as used herein, the term "comprise", "include", or any variation thereof, is intended to encompass all non-exclusive inclusion, such that a process, method, article, or system that comprises a series of elements is not limited to only those elements, and may include other elements not expressly listed or inherent to the process, method, article, or system. An element preceded by "comprising/including a/an . . . " does not, without more constraints, exclude the presence of additional identical elements in the process, method, article, or system that comprises the element.

The serial numbers of the above embodiments of the present disclosure are for descriptive purpose only, and cannot indicate preference for an embodiment.

Through the description of the above embodiments, those skilled in the art can clearly know that the methods according to the above embodiments may be implemented by means of software plus necessary general hardware platforms, and it is certain that the method may be implemented by hardware. However, in many cases, the former may be a preferred embodiment. Based on such understanding, the technical solution of the present disclosure in essence or those parts of the technical solution that contribute to the existing technologies may be embodied in the form of a software product. Such a computer software product may be stored on an aforementioned storage medium (such as an ROM/RAM, a disk, or an optical disk), and include a plurality of instructions for enabling a terminal device (which may be a mobile device, a computer, a server, an air-conditioner, or a network device and so on) to execute the method described in respective embodiments of the present disclosure.

The above description merely relates to preferred embodiments of the present disclosure, and is not intended to limit its scope. Any equivalent structural or process variations made by references of the description and accompanying drawings of the present disclosure, applied either directly or indirectly in other relevant technical fields, shall be included within the scope of the present disclosure.

What is claimed is:

1. A method for improving system DRAM reliability, comprising:
    obtaining an apparent voltage of a Dynamic Random Access Memory, called a DRAM, and performing a reliability check on a voltage value of the apparent voltage;
    calculating a voltage deviation value of a power supply voltage under an ideal DRAM model according to a verification result of the reliability check, wherein the voltage deviation value is a difference value between a power supply voltage corresponding to an optimal apparent voltage of the ideal DRAM model and a real-time power supply voltage; and
    adjusting the power supply voltage of the DRAM according to the voltage deviation value, to a logically output optimal voltage, so as to enable the apparent voltage to be in an optimal output state.

2. The method for improving system DRAM reliability according to claim 1, wherein after the step of adjusting the power supply voltage of the DRAM according to the voltage deviation value, the method comprises:
    performing the reliability check on the voltage value of the apparent voltage again after adjusting the power supply voltage of the DRAM; and
    returning, if a result of the reliability check is failure, to the step of calculating the voltage deviation value under the ideal DRAM model according to the verification result of the reliability check.

3. The method for improving system DRAM reliability according to claim 1, wherein the step of calculating the voltage deviation value of the power supply voltage under the ideal DRAM model according to the verification result of the reliability check comprises:
    increasing, if a result of the check is failure, a voltage test value of the power supply voltage by a preset voltage increment value, to obtain a new voltage test value of the power supply voltage.

4. The method for improving system DRAM reliability according to claim 1, wherein the step of calculating the voltage deviation value of the power supply voltage under the ideal DRAM model according to the verification result of the reliability check further comprises:
    decreasing, if a result of the check is success, a voltage test value of the power supply voltage by a preset voltage decrement value, to obtain a new voltage test value of the power supply voltage.

5. The method for improving system DRAM reliability according to claim 1, wherein the method for improving system DRAM reliability further comprises:
    obtaining a power supply capacitance value of the DRAM, and adjusting the power supply capacitance value of the DRAM according to a preset rule to obtain an adjusted capacitance value of the DRAM, until an apparent voltage corresponding to the adjusted capacitance value of the DRAM is greater than or equal to a preset threshold voltage.

6. The method for improving system DRAM reliability according to claim 5, wherein the step of obtaining the power supply capacitance value of the DRAM, and adjusting the power supply capacitance value of the DRAM according to the preset rule to obtain the adjusted capacitance value of the DRAM, until the apparent voltage corresponding to the adjusted capacitance value of the DRAM is greater than or equal to the preset threshold voltage comprises:
    determining whether the power supply voltage value of the DRAM changes according to the voltage deviation value;
    decreasing, if the power supply voltage value of the DRAM changes, the capacitance value of the DRAM by a preset capacitance decrement value, to obtain a test value of adjusted capacitance, and performing a reliability check on the adjusted capacitance; and
    returning, if a result of the reliability check is that the apparent voltage is less than the preset threshold voltage, to the step of: decreasing the capacitance value of the DRAM by a preset capacitance decrement value, to obtain the test value of the adjusted capacitance, and performing a reliability check on the adjusted capacitance, until the apparent voltage corresponding to the adjusted capacitance of the DRAM is greater than or equal to the preset threshold voltage.

7. The method for improving system DRAM reliability according to claim 6, wherein the step of obtaining the power supply capacitance value of the DRAM, and adjusting the power supply capacitance value of the DRAM according to the preset rule to obtain the adjusted capacitance value of the DRAM, until the apparent voltage corresponding to the adjusted capacitance value of the DRAM is greater than or equal to the preset threshold voltage further comprises:

increasing, if the power supply voltage value of the DRAM does not change, the capacitance value of the DRAM by a preset capacitance increment value, to obtain a test value of adjusted capacitance, and performing a reliability check on the adjusted capacitance; and returning, if a result of the reliability check is that the apparent voltage is greater than or equal to the preset threshold voltage, to the step of: increasing the capacitance value of the DRAM by a preset capacitance increment value, to obtain the test value of the adjusted capacitance, and performing the reliability check on the adjusted capacitance, until the apparent voltage corresponding to the adjusted capacitance of the DRAM is less than the preset threshold voltage.

8. The method for improving system DRAM reliability according to claim 5, wherein a capacitor is a variable capacitor.

9. An apparatus for improving system DRAM reliability, comprising a memory, a processor, and a program for improving system DRAM reliability that is stored on the memory and capable of running on the processor, wherein the program for improving system DRAM reliability, when executed by the processor, implements steps of the method for improving system DRAM reliability according to claim 1.

10. A non-transitory computer readable storage medium storing a program for improving system DRAM reliability thereon, wherein the program for improving system DRAM reliability, when executed by a processor, implements steps of the method for improving system DRAM reliability according to claim 1.

11. The method for improving system DRAM reliability according to claim 2, wherein the step of calculating the voltage deviation value of the power supply voltage under the ideal DRAM model according to the verification result of the reliability check comprises:

increasing, if a result of the check is failure, a voltage test value of the power supply voltage by a preset voltage increment value, to obtain a new voltage test value of the power supply voltage.

12. The method for improving system DRAM reliability according to claim 2, wherein the step of calculating the voltage deviation value of the power supply voltage under the ideal DRAM model according to the verification result of the reliability check further comprises:

decreasing, if a result of the check is success, a voltage test value of the power supply voltage by a preset voltage decrement value, to obtain a new voltage test value of the power supply voltage.

13. The method for improving system DRAM reliability according to claim 6, wherein a capacitor is a variable capacitor.

14. The method for improving system DRAM reliability according to claim 7, wherein a capacitor is a variable capacitor.

* * * * *